United States Patent [19]

Dubois

[11] 4,322,261

[45] Mar. 30, 1982

[54] METHOD OF MANUFACTURING A SOLAR CELL PANEL

[75] Inventor: Pierre Dubois, Paris, France

[73] Assignee: Societe Anonyme dite: Compagnie Generale d'Electricite, Paris, France

[21] Appl. No.: 196,794

[22] PCT Filed: May 21, 1979

[86] PCT No.: PCT/FR79/00044

§ 371 Date: Jan. 21, 1980

§ 102(e) Date: Jan. 21, 1980

[30] Foreign Application Priority Data

May 19, 1978 [FR] France .................. 78 14917

[51] Int. Cl.³ .......................................... H01L 31/18
[52] U.S. Cl. ................................. 156/280; 136/251; 156/295; 156/307.1; 156/307.7; 156/329; 156/300; 427/359; 427/387
[58] Field of Search .............. 136/251; 156/280, 295, 156/300, 307.1, 307.7, 309.6, 329; 427/359, 387

[56] References Cited

U.S. PATENT DOCUMENTS

| 3,667,993 | 6/1972 | Stevenson | 428/447 |
| 4,057,439 | 11/1977 | Lindmayer | 136/251 |
| 4,067,764 | 1/1978 | Walker et al. | 156/267 |

*Primary Examiner*—Aaron Weisstuch
*Attorney, Agent, or Firm*—Sughrue, Mion, Zinn, Macpeak and Seas

[57] ABSTRACT

The photovoltaic cells (6) are retained and protected by a transparent elastomer layer (12) extruded when hot prior to vulcanization and applied against the cells with a slight pressure to cause it to go into the spaces between cells, and vulcanized by heating, for example at 110° C. or at 180° C., thanks to the presence of incorporated peroxides.

Application in the production of electricity from solar energy.

4 Claims, 2 Drawing Figures

METHOD OF MANUFACTURING A SOLAR CELL PANEL

FIELD OF THE INVENTION

The invention concerns a solar cell panel and its manufacturing method.

BACKGROUND OF THE INVENTION

A variety of manufacturing methods for such panels are known.

Such methods are described in the annual report "Investigation of test methods, material properties, and processes for solar cell encapsulants" (JPL Contract 954527, Springborn Laboratories, July 1977 published by ERDA in the United States of America).

Various materials usable for encapsulation are also described in the final report "Review of World experience and properties of materials for encapsulation of terrestial photovoltaic arrays" (JPL Contract 954328, Battelle-Columbus Laboratories, July 1976, published by ERDA).

According to a known method, solar cells provided with their electrical connections are disposed on a rigid support plate whereon a thin bonding layer of silicone has been previously poured, and a second layer of transparent silicone is poured on the assembly which assures simultaneously the lateral retention of the cells and the protection of their upper faces. An outer protective layer of glass, for example, can be added. Such a method is for example described in U.S. Pat. No. 4,057,439 (Lindmayer).

The implementing of this method is tricky industrially in that the operation of pouring the liquid is a long one and must be carried out with care to obviate the presence of blisters and dust.

It is an object of the present invention to allow a quicker and easier manufacture of photovoltaic solar cell panels.

SUMMARY OF THE INVENTION

The present invention provides a photovoltaic solar cell panel comprising
a lower support plate,
photovoltaic cells disposed on this lower plate with spaces therebetween,
electrical connections for these cells,
a transparent polymerized encapsulation elastomer is disposed on this rear plate in the spaces between the cells to retain them laterally, and on these cells to constitute a protective layer, characterized by the fact that the elastomer is of a type which is extrudable when cold and vulcanized when hot.

The invention also provides a manufacturing method for a panel of photovoltaic solar cells, comprising the following operations:
disposing photovoltaic cells on a lower support plate and establishing electrical connections for these cells,
disposing a transparent upper encapsulation layer for retention and protection on these cells characterized by the fact that the encapsulation layer is disposed in the form of a soft layer of un-vulcanized elastomer,
pressing this layer of elastomer against the cells and the support plate to cause it to go into the spaces between the cells,
and vulcanizing this layer.

With the aid of schematic FIGS. 1 and 2 appended hereto, hereafter follows a description, by way of example and not limiting, of how the invention can be implemented. It must be understood that the elements described and represented can be replaced, without departing from the scope of the invention, by other elements assuring the same technical functions. When the same element is shown in these two figures it is indicated by the same reference symbol.

DESCRIPTION OF THE PREFERRED EMBODIMENT

Figure 1:
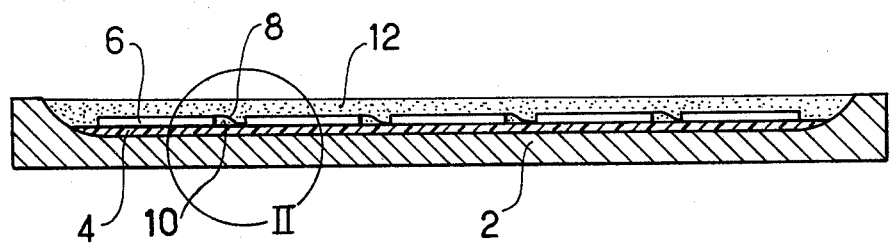
FIG. 1 is a sectional view of a panel according to the invention.
Figure 2:
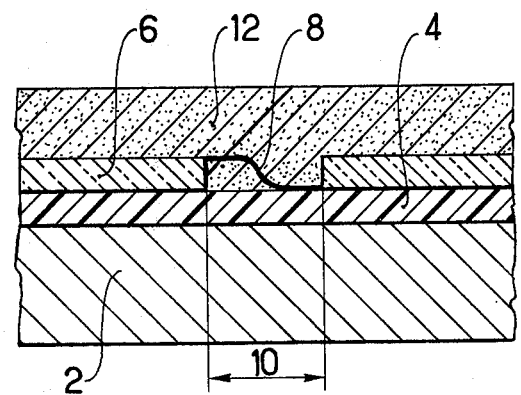
FIG. 2 is an enlarged sectional view of a part of FIG. 1.

A panel according to the invention comprises a rigid lower support plate 2, constituted for example of aluminum, or of polyester resin reinforced with glass fiber, and presenting raised edges to form a dish.

On the support plate there is poured or disposed a not very thick layer 4 of silicone, less than 1 mm, to function as elastic adhesive. This can be for example a silicone elastomer of the RTV type, that is to say polymerizable when cold, or of the EVC type, that is to say polymerizable when hot.

To this adhesive layer there are applied (under a pressure of 800 g/cm$^2$ for example) photovoltaic cells 6, 100 mm in diameter, 300 microns thick and constituted of single-crystal silicon. These cells are completely metallized on their lower faces and have a metal grid deposited on their upper face, and they are electrically connected in series, that is to say by the lower face of one cell 6 connected to the upper face of the adjacent cell, via non-taut tinned copper strips 8 which are 0.2 mm thick and 1 mm wide.

On this assembly there is disposed a uniformly thick sheet (1 to 2 mm for example) constituted by an un-vulcanized extruded silicone elastomer. This can, for example, be a methylpolysiloxane of high molecular weight modified to allow its vulcanization when hot under the effect of a peroxide, such as the silicone elastomer sold in France under the commercial reference RP 778 by the Société des Usines Chimiques Rhone-Poulenc (See the commercial publication Rhodorsil Silicone Information, June 1974, No. X001).

There has been previously incorporated in this elastomer a benzoyl or dicumyl peroxide to allow its polymerization at 110° C., or at 180° C., in a few minutes, for example. (The proper proportions are known by the man skilled in the art, for example 1.25% with for example dichloro 2-4 benzoyl peroxide).

This elastomer must be transparent after vulcanization to allow transmission of maximum light that has a wavelength comprised between 500 and 600 nanometers. Prior to vulcanization it must be extrudable to provide by extrusion manipulatable plates, but sufficiently non-cohering to be deformable under slight pressure.

This plate is pressed, for example with the aid of a roller such as to cause it to go into the spaces such as 10 between the cells such as 6 and to cause it to fully fill up these spaces by penetrating under the metal connection strips such as 8.

The roller can be for example constituted of polytetrafluoroethylene, with a diameter of between 10 and 50 cm. The pressure can be 20 or 30 kg/cm$^2$, and must in any event be chosen sufficiently low not to damage the cells, while being sufficient to assure a good penetration by the elastomer. The roller, in moving across the elastomer, creates a local progressive pressure to facilitate penetration by the elastomer into the spaces between the cells.

Such an operation is far easier than pouring particularly because the progress of the pressure roller assures elimination of gases, and because a rapid polymerization can accompany it. Vulcanization is then carried out by heating under slight pressure (for example 10 kg/cm$^2$).

One thus obtains a transparent protective and retaining layer 12, which is polymerized. The panel thus manufactured is ready for use, if necessary after further protection, in association with other panels, to produce electricity from solar energy.

I claim:

1. A method of manufacturing a panel of photovoltaic solar cells, said method comprising the following steps:

disposing photovoltaic cells on a lower support plate and establishing electrical connections for these cells;

disposing on the cells an upper transparent encapsulation layer to retain and protect these cells;

the improvement comprising:

disposing the encapsulation layer in the form of a soft layer of un-vulcanized elastomer;

lightly applying on said un-vulcanized elastomer layer, a local progressive pressure to press it against the cells and the support plate to cause it to flow into the spaces between the cells; and vulcanizing this layer.

2. The method as claimed in claim 1, wherein said layer of elastomer is pressed against the cells with the aid of a pressure roller.

3. The method as claimed in claim 1, wherein the encapsulation elastomer is a silicone elastomer.

4. The method as claimed in claim 3, wherein the encapsulation elastomer is a methylpolysiloxane of high molecular weight modified to allow polymerization when hot under the effect of an incorporated peroxide.

* * * * *